United States Patent [19]
Larabell

[11] Patent Number: 5,973,919
[45] Date of Patent: Oct. 26, 1999

[54] MEMORY STORAGE SYSTEM HAVING REMOVABLE MEMORY STORAGE DEVICE CONTROLLERS

[75] Inventor: Henri J. Larabell, Cupertino, Calif.

[73] Assignee: Silicon Gear Corporation, San Jose, Calif.

[21] Appl. No.: 08/538,948

[22] Filed: Oct. 4, 1995

[51] Int. Cl.[6] .................................................. H05K 7/10
[52] U.S. Cl. ........................................................... 361/684
[58] Field of Search ........................ 395/182.04, 182.05;
360/98.01; 361/685, 684

[56] References Cited

U.S. PATENT DOCUMENTS

| | | | |
|---|---|---|---|
| 4,853,830 | 8/1989 | Corfits et al. | 361/725 |
| 4,899,254 | 2/1990 | Ferchau et al. | 361/695 |
| 4,922,125 | 5/1990 | Casanova et al. | 361/724 X |
| 4,941,841 | 7/1990 | Darden et al. | 361/685 |
| 5,077,722 | 12/1991 | Geist et al. | 361/685 X |
| 5,471,099 | 11/1995 | Larabell et al. | 307/53 |
| 5,784,644 | 7/1998 | Larabell | 395/829 |

*Primary Examiner*—Leo P. Picard
*Assistant Examiner*—John B. Vigushin
*Attorney, Agent, or Firm*—Douglas A. Chaikin; Peninsula IP Group

[57] ABSTRACT

A memory storage system which facilitates swappability of memory storage device controllers includes a circuit assembly, a host system connector, controller connectors, memory storage device connectors and a display. The circuit assembly attaches to memory storage devices, memory storage device controllers and a host system. The circuit assembly enables rapid removal and replacement of memory storage device controllers from the memory storage system during operation of the memory storage system. The display electronically communicates with the circuit assembly and indicates which host system data bus the controller connector is associated with. The display also indicates the SCSI ID of the controller connector.

1 Claim, 4 Drawing Sheets

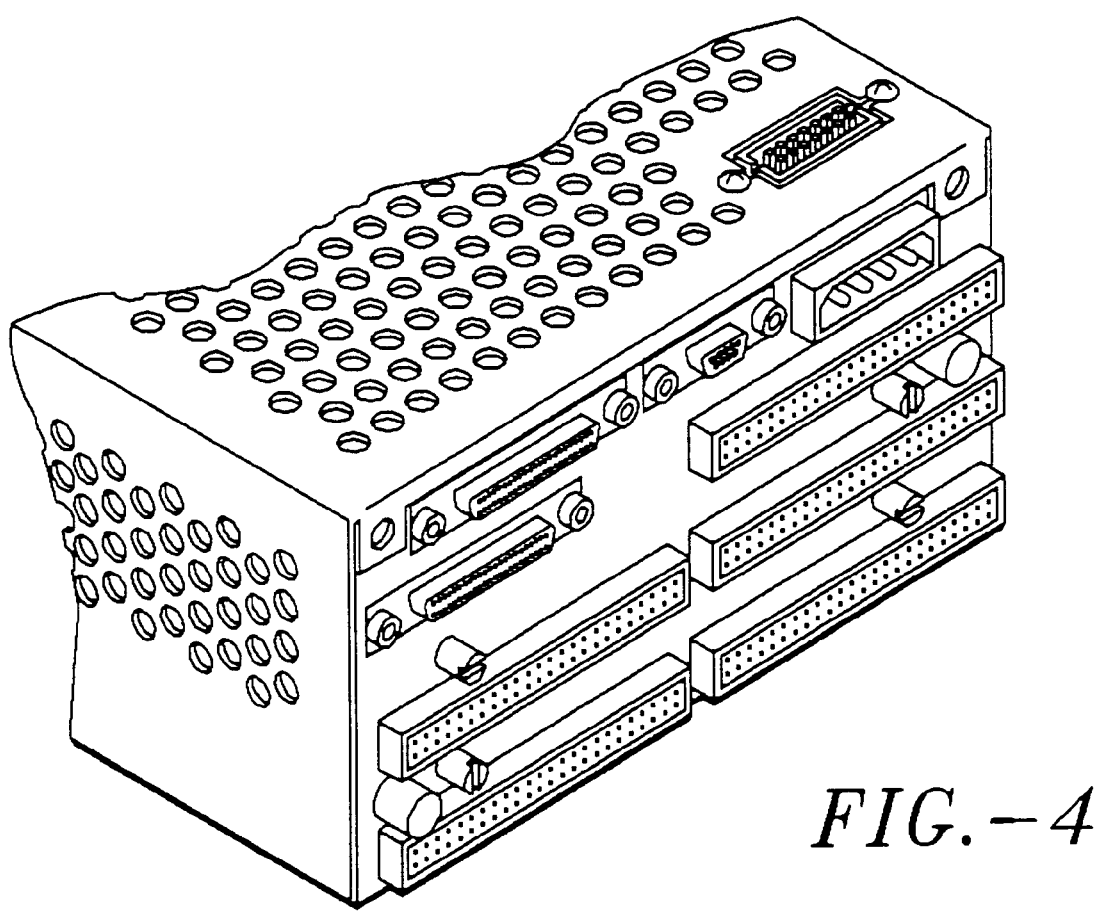
FIG.—4

MEMORY STORAGE SYSTEM HAVING REMOVABLE MEMORY STORAGE DEVICE CONTROLLERS

CROSS REFERENCE TO RELATED PATENT APPLICATIONS

This patent application relates in subject matter to commonly assigned U.S. Pat. No. 5,471,099, issued Nov. 28, 1995 to Larabell et al. and titled MODULAR ENCLOSURE APPARATUS and to commonly assigned U.S. patent application Ser. No. 08/384,553 which was filed Feb. 2, 1995, the disclosures of each related patent application are incorporated herein by reference.

BACKGROUND OF THE INVENTION

1. Field of the Invention

This invention relates to computers and memory storage systems. More particularly, this invention relates to memory storage systems having swappable elements.

2. Previous Art

Typically a host system such as a computer system will have at least one data bus capable of communicating digital signals between a processor and a memory storage device. Often single data buses serially connect with numerous memory storage devices such as is common in systems which employs SCSI architecture. SCSI is an acronym for small computer standard interface.

Increased data storage capacity and through-put are demanded in the marketplace. This demand has driven the development of computer systems with multiple data buses. Multiple buses provide a wider channel for communicating data through than a single bus may provide. The wider channel provided with serial computer subsystems enables more rapid through-put. The wider channel enables increased storage capacity in memory storage systems by enabling increasing numbers of memory storage devices to be connected with the channel.

Multiple memory storage devices have been arranged in an array to increase data storage capacity. The array communicates with the host system bus so that the host system may simultaneously communicate with multiple memory storage devices. Various computer systems have hundreds of discrete memory storage devices arranged in arrays to achieve hundreds, and even thousands, of gigabytes of memory storage capacity.

Data reliability in memory storage systems is important. The more memory storage devices which operate in a system, the higher the likelihood one will fail. If a single memory storage device fails, data may be lost. In order to increase data reliability, redundancy between memory storage devices may be introduced such as in a RAID system. RAID is an acronym for "Redundant Array of Independent Disks".

RAID systems typically rely on a device controller (e.g. RAID controller) to regulate the operation of memory storage devices such as hard disk drives, in an array. The device controller, while often appearing to the host system as a single memory storage device, may regulate multiple memory storage devices. For example, a device controller may employ data storage methods including data striping and parity across numerous memory storage devices.

To improve host system reliability by reducing the probability of down time, storage systems having redundant controllers have been introduced. With redundant controllers, when one controller fails another controller assumes the role of the failed controller to provide continuity of operation of the memory storage system. The failed controller may then be swapped with a new controller when the host system is shut down for maintenance.

Several problems exist with systems having redundant device controllers. The physical location of a failed device controller may be difficult or virtually impossible to identify. Often the host system must often be shut down to facilitate replacement of a failed device controller. Replacement of a single device controller may require disconnection of multiple buses and other connectors as well as removal of numerous fasteners. These problems are sought to be overcome.

Generally, when a device controller fails, the host system will typically alert a system administrator or technician through a message displayed on the system administrators computer screen. The message may identify the failed device controller by a SCSI ID numeral and a bus ID numeral. The physical location of the failed device controller is generally not available.

Identification of the physical of location of a failed device controller may require removal and testing of each device controller in a system until the failed controller is found. Removal of the wrong controller can cause failure of multiple memory storage devices and loss of data. What is desired is a way to readily identify the physical location of a device controller such as a failed device controller ease replacement of the device controller.

Replacement of a device controller may be a time consuming and multi-step process. To illustrate, an example of a known device controller is shown in FIG. 4. The device controller in FIG. 4 includes multiple data ports. The multiple data ports are capable of various connections. The various connections include connection with host data buses, memory storage device buses, a power cable, a serial interface and fault signal buses, for example. Each bus must be removed and reconnected to facilitate replacement of the controller.

The replacement of a device controller having multiple data ports may take hours to complete. Additionally, there is a possibility that the buses may be incorrectly connected. What is desired is a simple way to interconnect device controllers with a memory storage system.

Host system downtime is undesirable. Replacement of a failed device controller often causes memory storage system and/or host system downtime. What is desired is a way of replacing a failed device controller without host and/or memory storage system downtime.

SUMMARY AND OBJECTS OF THE INVENTION

It is a object of this invention to provide a system connectable with device controllers which are replaceable without requiring system downtime.

It is another object of this invention to provide a system capable of readily identifying memory storage device controllers.

It is another object of this invention to provide a system capable of simply and easily replacing device controllers.

In accordance with the aforementioned objects and those that will be mentioned and will become apparent below, a memory storage system connectable with memory storage devices, device controllers, and a host system having a data bus, comprises:

a circuit assembly connectable to the data bus and the memory storage devices for interfacing between the host system and the memory storage devices; and the circuit assembly having a controller connector for removeably connecting the controller to the data bus and the memory storage devices, whereby the device controllers are removeable from the memory storage system.

In a preferred embodiment, each controller connector includes a card edge connector which is slidably attachable with the device controllers to facilitate swappability of the device controllers.

In another preferred embodiment, a power switch electronically attaches to the circuit assembly for selectively connecting and disconnecting power to each controller connector. The power switch facilitates swappability of device controllers during operation of the memory storage system.

In another preferred embodiment, the memory storage system has multiple host system connectors electronically attached with the circuit assembly. The host system connectors electronically connect the memory storage system with multiple host system data buses.

In another preferred embodiment, the circuit assembly includes pin connectors. The memory storage devices removeably attach to the pin connectors. The device controllers slidably attach to the controller connectors to regulate operation of the memory storage devices.

In another preferred embodiment, a housing partially encloses the circuit assembly, an auxiliary display attaches to the housing and electronically connects with the circuit assembly.

In another preferred embodiment, a housing partially encloses the circuit assembly to support the circuit assembly, the memory storage devices and the device controllers.

In another preferred embodiment, the memory storage system includes a power switch and a lock. The lock attaches to the housing for selectively locking a device controller with the housing when power is connected. The lock selectively unlocks the device controller from the housing when power is disconnected.

In another preferred embodiment, the housing has a face and locks, the face has controller openings for receiving device controllers. Each lock rotatably attaches to the face of the housing adjacent a respective controller opening for selectively locking device controllers with the housing.

It is an advantage of the invention to provide a memory storage system which enables replacement of memory storage device controllers without requiring system downtime.

It is a further advantage of the invention to provide a memory storage system which identifies memory storage device controllers with a SCSI ID numeral and with a data bus ID numeral.

BRIEF DESCRIPTION OF THE DRAWING

For a further understanding of the objects and advantages of the present invention, reference should be given to the following detailed description, taken in conjunction with the accompanying drawings, in which like parts are given like reference numerals and wherein:

FIG. 4 is a rear view of known device controller showing multiple cable ports.

DETAILED DESCRIPTION OF THE INVENTION

Figure 1:
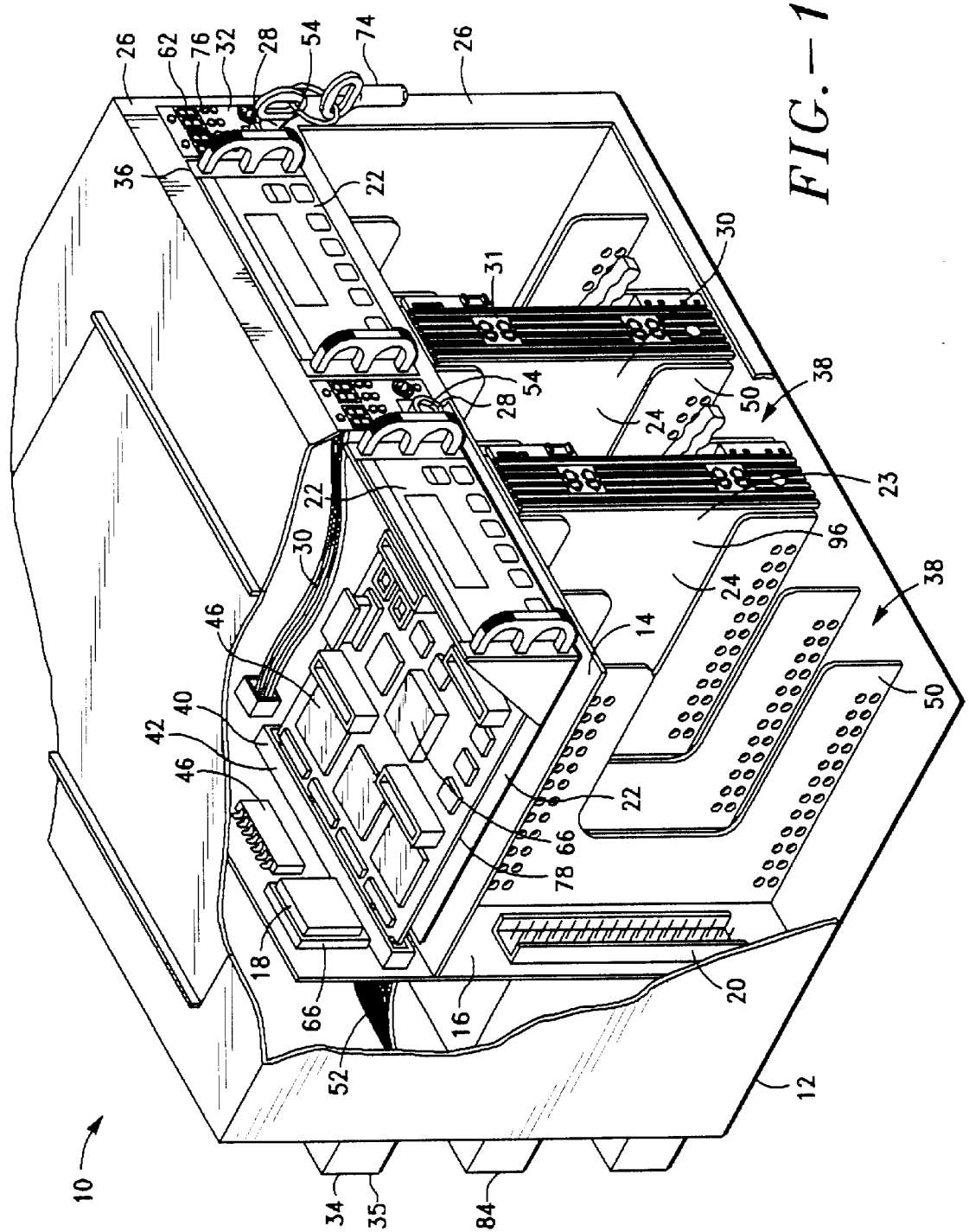
FIG. 1 is a partially cut away perspective view of a housing in accordance with the present invention.

With particular reference to FIG. 1, there is shown a memory storage system generally designated with the reference numeral 10. The memory storage system 10 includes a circuit assembly 16 having controller connectors 40, memory storage device connectors 20 and host system connectors 34. Device controllers 22 and memory storage devices 24 removeably attach to the controller connectors 40 and memory storage device connectors 20 respectively. Removable attachment of the device controllers 22 to the circuit assembly 16 readily enables replacement of the device controllers 22.

A housing 12 encloses the memory storage system 10. The housing 10 is configured to hold eight memory storage devices 24 and two device controllers 22. In another embodiment, the housing 10 is configured to hold four memory storage devices. Although the housing 12 shown in FIG. 1 is capable of holding a limited number of memory storage devices 24, it can be appreciated that various embodiments of the present invention include a housing 12 adapted to hold an array of memory storage devices 24 (e.g. hundreds) and multiple device controllers 22.

The device controllers 22 regulates the memory storage devices 24 to provide redundant storage of data in accordance with any of the various industry accepted RAID standards. In one embodiment of the present invention the device controllers 22 include a commercially available memory storage RAID controller having dual SCSI drive channels and a SCSI host interface. In a variation of this embodiment, the RAID controller includes a Mylex Model 960 Controller such as marketed by Mylex Inc.

The circuit assembly 16 interconnects the memory storage devices and the device controllers via two SCSI buses. Accordingly, the circuit assembly 16 communicates with the device controllers 22 and memory storage devices 24 via SCSI architecture.

The device controllers 22 periodically poll associated memory storage devices 24. The microprocessor 18 periodically polls each device controller 22 to sense environmental factors. Examples of environmental factors include temperature, fan operation, device failure, power failure and removal of a device. In one embodiment, the microprocessor 18 processes the environmental factors and regulates operation of the device controllers 22. In another embodiment, the microprocessor 18 communicates the environmental factors to a host system which, in turn, directs the operation of the device controllers 22.

The controller connector 40 includes a card edge connector 42 which is specifically configured for slidable attachment with a card edge. The card edge connector 42 rigidly attaches to the circuit assembly 16.

Each device controller 22 includes a card edge 48. The card edge 48 slidably attaches with the card edge connector 42. The slideable connection between the device controllers 22 and the circuit assembly facilitates swappability of the device controllers 22 when the device controllers 22 are pulled perpendicularly outward from the housing 12.

It can be appreciated that various removable controller connectors 40 may be used in accordance with the present invention to ease swappability of device controllers. For example, various suitable controller connectors 40 such as a pin connector may be used.

The memory storage device connector 20 includes a pin connector 44. The pin connector 44 removeably connects with memory storage devices 24 to facilitate swappability of the memory storage devices 24. In one embodiment, the memory storage device 24 includes a hard disk drive 30 mounted on a hot swappable carrier 23 having display features. The carrier 23 has a display 31 which shows SCSI ID and controller ID of the memory storage device 24.

An example of a memory storage device 24 with a hot swappable carrier is disclosed in commonly assigned U.S. patent application Ser. No. 08/384,553, the disclosure of which is incorporated herein by reference. It can be appreciated that multiple memory storage device types can be adapted for use with the present invention including optical disk drives, tape drives and the other devices capable of storing digital data.

The host system connectors 34 include serial port connectors 35 for attachment with a host system data bus. A ribbon cable 52 electronically attaches each host system connector 34 with the circuit assembly 16. Accordingly, the host system connectors 34 interconnect the memory storage system 10 with a host system. In one embodiment, the host system connectors 34 include a serial port connector 35 which is attachable with a host system having 16 bit data buses.

The housing 12 has a face 26, power switch 28, an auxiliary display 32. The host system connectors 34 attach to the housing 12 opposite the face 26. The face 26 of the housing includes controller openings 36 and memory storage device ports 38 for receiving device controllers 22 and memory storage devices 24 respectively. Each memory storage device port 38 includes rails 50 for removeably guiding memory storage devices 24 into the housing 12.

In one embodiment, the housing 12 is adapted to have a circuit assembly 16 and the capability to removeably hold a single device controller 22. The housing encloses portions of the circuit assembly 16 and the device controller 22. The housing exposes a portion of the circuit assembly 16 to facilitate connection of the circuit assembly 16 with memory storage devices and data buses. A controller connector 40 removeably interconnects the controller 22 and the circuit assembly16 within the housing 12 to facilitate swappability of the device controller 22 from the housing 12.

The auxiliary display 32 and the power switch 28 mount on the face 26 of the housing 12 for accessibility. Wires 29 interconnect the auxiliary display 32 and the power switch 28 with the circuit assembly 16 to establish communication between the processor 18 and the auxiliary display 32.

The platform 14 mounts in the housing 12. One end of the platform 14 attaches perpendicularly to the face 26 for supporting the device controllers 22. The platform 14 has another end which attaches to the circuit assembly 16. The platform 14 slidably connects with the device controllers 22 to guide device controllers 22 towards the controller connector 40. The platform 14 facilitates a precise slidable connection between the circuit assembly 16 and the device controllers 22.

Each device controller includes a processor 66 which directs the operation of the device controllers 22 to facilitate swappability of each device controller 22. The processor 66 of one device controller 22 periodically polls the other device controller. Such polling recognizes when one device controller fails. Recognition that one device controller 22 has failed enables the other device controller 22 to assume the duties of the failed device controller to facilitate redundancy between two controllers 22.

When the memory storage system 10 is powered and operates, the device controllers 22 regulate operation of the memory storage devices 24. The device controllers 22 are individually removable from the housing during operation of the system 10. Removal of a device controller 22 is desirable, for example, when one device controller 22 fails and is desired to be swapped with a new controller 22.

Figure 2:
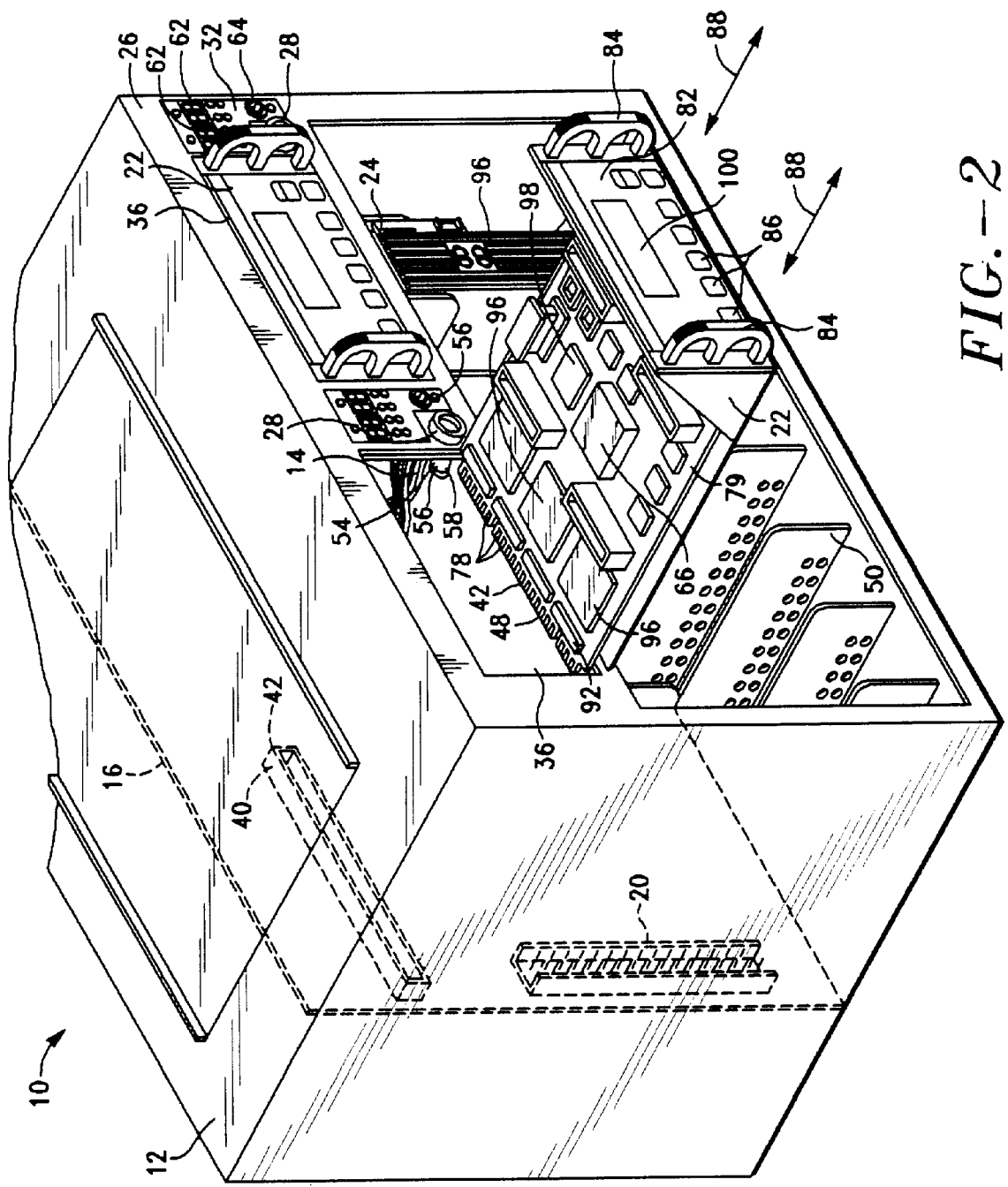
FIG. 2 is a perspective view of the housing of FIG. 1.

With particular reference to FIG. 2 there is shown a device controller 22 removed from the memory storage system 10.

The power switch 28 attaches to the housing 12 and includes a lock 54. The lock 54 includes a rotatable cylinder 56 and a locking extension 58. The extension 58 protrudes perpendicularly from the cylinder 56 and latches with the device controller 22 to selectively hold and release the device controller 22 from the housing 12. The lock 54 inhibits removal of a device controller 22 when power is supplied to the device controller 22. The lock 54 also inhibits inadvertent removal of a device controller 22. The lock 34 includes a removable key 74 (FIG. 1). The key 74 facilitates removal of a device controller 22 by authorized users.

The power switch 28 mounts on the face 26 of the housing 12 and is associated with a respective card edge connector 42. The power switch 28 connects power to the associated card edge connector 42 when the lock 54 latches to hold the device controller 22. The power switch 28 disconnects power to the associated card edge connector 42 when the lock releases the device controller 22.

Selectively connecting power to the card edge connector 42 when the device controller 22 locks with the housing 12 inhibits arcing of electricity which may scar both the card edge connector 42 and the card edge 48 of the device controller 22. Selective connection of power to the card edge connector 42 inhibits power surges to the device controller 22 during swapping of the device controller 22. Accordingly, the power switch 28 facilitates swappability of the device controllers 22 during continuous operation of the memory storage system 10.

The auxiliary display 32 attaches to the face 26 of the housing 12 adjacent to the controller opening 36. Each auxiliary display 32 is associated with a device controller 22 and positioned adjacent the associated device controller 22.

Each device controller 22 can be identified by the host system by a controller channel ID (e.g. host channel ID) and by a SCSI ID. One numerical display 32 shows the ID numeral of the data bus which connects each controller to the host system (e.g. the host channel ID) and the a SCSI ID numeral of the associated device controller 22.

It can be appreciated that a host system may identify the electronic location of a failed device controller with the SCSI ID and the controller channel ID of the failed device controller. A technician uses the numerical displays 32 to identify the physical location of the device controller. The numerical displays 32 facilitate identification of the physical location of a failed device controller by displaying the SCSI ID and the controller channel ID to the technician.

During normal operation of the memory storage system 10, the processor 18 periodically polls each device controller 22 to determine that each controller properly functions and to detect failure of a device controller 22. The processor 18 performs calculations and manipulations such as required for calculating data striping, parity and performing data rebuild. Data rebuild is a useful mechanism which recovers data which is striped across a memory storage device array having a failed memory storage device. In one embodiment, the processor 18 includes a model Dallas 80-C320 microchip.

To facilitate redundancy between controllers 22, the device controllers 22 operate in active/active mode. In another embodiment, the device controllers operate in active/passive mode.

During active-active mode, the card edge connectors 42 are simultaneously active to enable simultaneous communication of data between both device controllers 22 memory storage devices 24. In active-active mode, the device controllers 22 communicate simultaneously with the host system. It can be appreciated that should one device controller fail in active-active mode, the other device controller 22 assumes the additional burden of operation of the failed device controller 22.

During passive-active mode, one controller 22 is active and the other is passive. The passive controller 22 stands by and does not normally regulate memory storage devices 24. The passive device controller 22 polls the active device controller 22 to determine if the active device controller 22 functions properly. When the active device controller 22 fails, the passive device controller 22 becomes active and communicates with the memory storage devices 24 and with the host system. Accordingly, the passive device controller 22 assumes the burden of operation of the failed device controller 22.

As shown by the arrows 88, the device controller 22 slides perpendicularly from the face 26 of the housing 12 to facilitate removal and replacement (i.e. swappability) of the device controller 22. The memory storage devices 24 are removable from the housing 12 by sliding perpendicularly from the face 26.

The device controller 22 includes a controller circuit board 79 and a controller display 82. The controller circuit board 78 includes random access memory (RAM) 92, the controller processor 66, three SCSI interface chips 96, and a SCSI driver microchip 98 such as manufactured by NCR corporation. Contacts 78 attach to the card edge 48 to facilitate electronic communication between the card edge 48 and the card edge connector 42.

The controller display 82 has handles 84, buttons 86 and a display screen 100. The buttons 86 facilitate manual entry of raid set instructions into the device controller 22. The controller display screen 100 displays information such as text to prompt and verify the manual entry of raid set instructions. The controller display 82 communicates the manually input raid set instructions to the controller processor 66. The controller processor 94 in turn communicates with the processor 18 of the circuit assembly 16 via the card edge 48.

The controller processor 66 receives and communicates instructions to and from the device controller 22. The RAM 92 caches instructions from the circuit assembly 16, such as instructions which originated from the host system. In one embodiment, the controller processor 66 is an Intel 960 processor.

Figure 3:
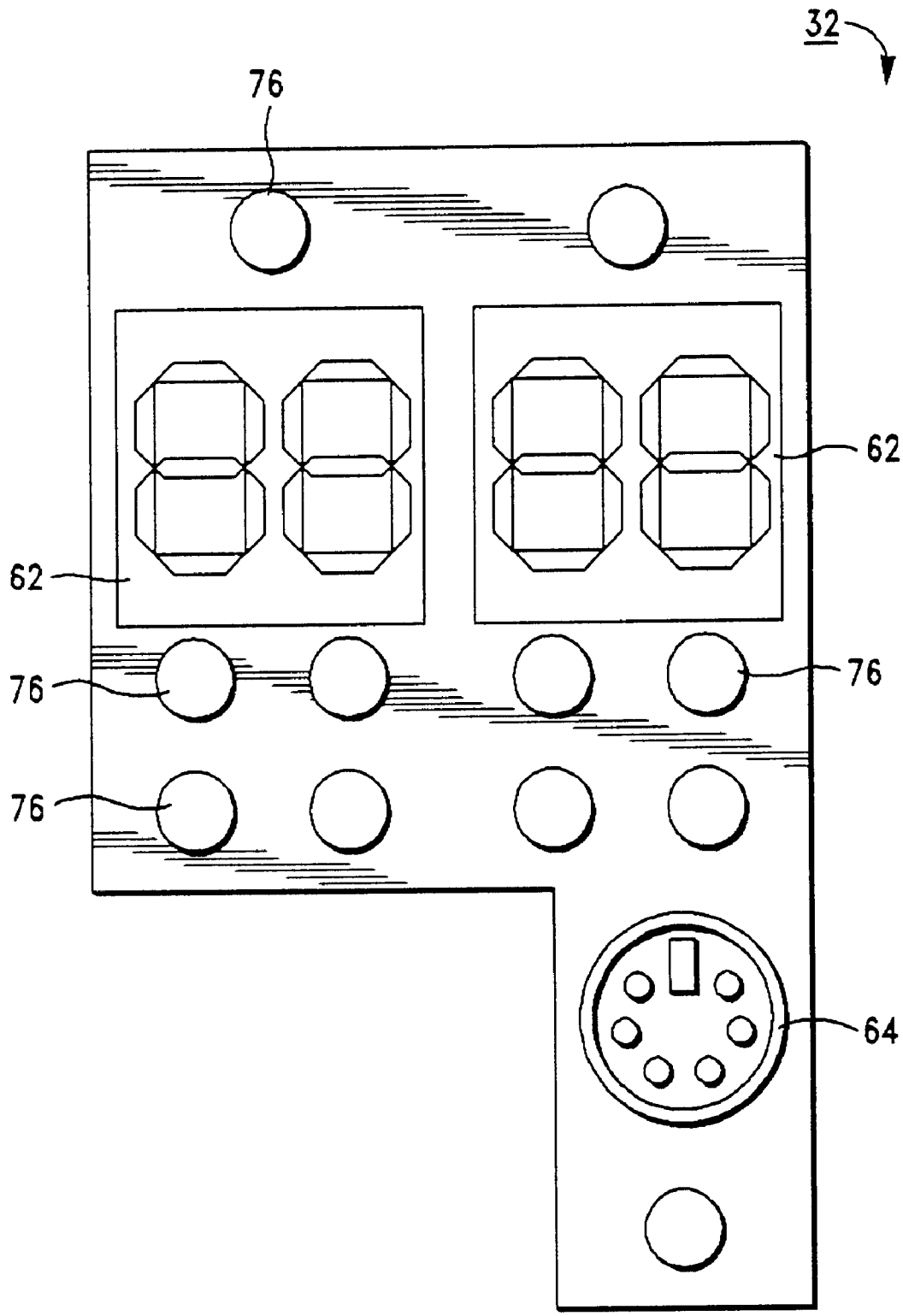
FIG. 3 is a view of the auxiliary display of FIG. 2.

With particular reference to FIG. 3, there is shown a view of the auxiliary display 32. The auxiliary display 32 includes a serial port 64. The serial port 64 is a RS 232 type serial port which is connectable with an electronic device such as a general purpose computer. The serial port 64 may receive data from the electronic device to facilitate configuration of the circuit assembly 16. More particularly, the serial port 64 may receive raid set instructions.

The auxiliary display 32 includes two numerical displays 62 and eight light emitting diode lights (LED indicators) 76. The numerical displays 62 and the LED's 76 electronically connect with the circuit assembly 16. The numerical displays 62 illuminate to be highly visible and indicate to which data bus an associated device controller (FIG. 2) connects. In one embodiment, each display shows SCSI ID and a host data bus ID. In another embodiment, each display shows a SCSI ID and a controller bus ID such as when multiple controller buses extend from one host data bus.

The circuit assembly 16 directs the LED indicators to selectively maintains an illuminated state and a non-illuminated state. Each LED indicator is labeled for a particular function. The LED indicators 76 illuminate to indicate power failure; fan failure; master and slave status of the associated device controller; single ended device connection; differential device connection; memory storage device failure; and excessive temperature. The cause of a failure in the system (e.g. memory storage device controller power failure, fan failure, temperature failure, various system component failure etc.) is displayed by the auxiliary display 32 through the LED indicators 76. The auxiliary display 32 provides information to enable rapid calibration and replacement of the controller (e.g. single ended/differential device configuration and master/servant status).

IN OPERATION

In use, the memory storage system 10 of the present invention becomes operational when a device controller 22 and a memory storage device 24 removeably attach with the housing 12. The memory storage device 24 and device controller 22 electronically attach to the memory storage device connector 20 and the controller connector 40 respectively.

Attachment of a second device controller 22 facilitates redundancy between the device controllers. The device controllers, 22 direct operation of the memory storage devices 24. When one controller 22 fails, or is removed, the other controller 22 senses the failure or removal and assumes the duty of operating the memory storage devices 22. In one embodiment, when the failed controller 22 is replaced, the replaced controller 22 senses operation of the operating controller 22 and remains inactive until the operating controller 22 fails.

In another embodiment, each of two controllers 22 normally share the burden of operating memory storage devices 24. When one controller 22 fails, the other device controller 22 operates the memory storage devices 24 to facilitate swappability of the failed controller 22.

One power switch 28 electronically attaches to the circuit assembly 16 and is associated with each controller connector 40 respectively. The power switch 28 selectively engages to provide power to an associated device controller 22. The power switch 28 selectively disengages to disconnect power to the associated device controller 22 prior to swapping of the device controller 22 to facilitate swappability of each controller.

The power switch 28 includes a lock 54. When the power switch 28 engages and provides power to the device controllers, the lock 54 automatically locks the associated device controller 22 with the housing 12 and with the controller connector 40. When the power switch 28 disengages to disconnect power to the device controllers, the lock 45 automatically unlocks the associated device controller 22.

While the foregoing describes the memory storage system 10 in terms of several embodiments, it is to be understood that the above detailed description is an example which is illustrative only and not limiting of the disclosed invention. It will be appreciated that it would be possible by one skilled in the art to modify a number of aspects of the system. For example, the attachment of the device controller 22 and the housing 12 can be modified to facilitate removal of the device controller 22. A variety of locking mechanisms may be substituted for the lock 54. The power switch 28 can be adapted to be automatically actuated. Various device controllers 22 can be adapted with circuitry to facilitate hot swappability of the device controllers 22. The memory storage devices 24 and the various other elements can be fully, or partially, integrated into a single machine. Accordingly, the present invention is to be limited only by the claims as set forth below.

What is claimed is:

1. A memory storage system connectable with memory storage devices, device controllers, and a host system having a data bus, comprising:

a circuit assembly connectable to the data bus and the memory storage devices for interfacing between the host system and the memory storage devices; and the circuit assembly having a controller connector for removeably connecting the controllers to the data bus and the memory storage devices, whereby the device controllers are removeable from the memory storage system;

wherein a power switch electronically attaches to the circuit assembly for selectively connecting and disconnecting power to each controller connector to facilitate swappability of the device controllers.

* * * * *